US005656942A

United States Patent [19]
Watts et al.

[11] Patent Number: 5,656,942
[45] Date of Patent: Aug. 12, 1997

[54] PROBER AND TESTER WITH CONTACT INTERFACE FOR INTEGRATED CIRCUITS-CONTAINING WAFER HELD DOCKED IN A VERTICAL PLANE

[75] Inventors: Michael P. C. Watts, Portola Valley; Lawrence Hendler, Cupertino, both of Calif.

[73] Assignee: Electroglas, Inc., Santa Clara, Calif.

[21] Appl. No.: 505,419

[22] Filed: Jul. 21, 1995

[51] Int. Cl.⁶ ........................................ G01R 31/02
[52] U.S. Cl. ........................ 324/754; 324/755; 324/758
[58] Field of Search ........................... 324/158.1, 73.1, 324/754, 758, 765, 755; 439/482; 414/590, 744 A, 744.1, 744.8; 33/533, 573

[56] References Cited

U.S. PATENT DOCUMENTS

| | | | |
|---|---|---|---|
| 3,940,676 | 2/1976 | Dudley | 318/612 |
| 4,066,943 | 1/1978 | Roch | 318/468 |
| 4,517,512 | 5/1985 | Petrich et al. | 324/73 R |
| 4,527,942 | 7/1985 | Smith | 324/758 |
| 4,588,346 | 5/1986 | Smith | 324/758 |
| 4,654,571 | 3/1987 | Hinds | 318/687 |
| 4,677,649 | 6/1987 | Kunishi et al. | 375/122 |
| 4,742,286 | 5/1988 | Phillips | 318/640 |
| 4,746,857 | 5/1988 | Sakai et al. | 324/765 |
| 4,751,457 | 6/1988 | Veendaal | 324/758 |
| 4,857,838 | 8/1989 | Willberg | 324/758 |
| 5,040,431 | 8/1991 | Sakino et al. | 74/479 |
| 5,172,053 | 12/1992 | Itoyama | 324/158 F |
| 5,187,431 | 2/1993 | Libretti | 324/158 P |
| 5,241,183 | 8/1993 | Kanai et al. | 250/453.11 |
| 5,241,870 | 9/1993 | Holt | 73/866.5 |
| 5,285,142 | 2/1994 | Galburt et al. | 318/640 |
| 5,321,453 | 6/1994 | Mori et al. | 324/754 |
| 5,329,226 | 7/1994 | Monnet et al. | 324/158.1 |
| 5,344,238 | 9/1994 | Roch | 384/49 |

OTHER PUBLICATIONS

ADE Corporation, Bulletin 480B, "Models PA-408/428: Non-Contact Wafer Prealigner", Jan. 1991, 2 pages.
Dover Instrument Corporation, Product Bulletin, "Precision Air Bearing Slides: Continuous Support, Linear Motor Series", Nov. 1993, 2 pages.
Dover Instrument Corporation, Product Bulletin, "Precision Air Bearing Slides: End Support, Lead Screw Series", Nov. 1993, 2 pages.
Kensington Laboratories, Inc., Fact Sheet, "Ergonomic Vertical Wafer/FPD Inspection Tool", Jun. 1994, 1 page.
Kensington Laboratories, Inc., Fact Sheet, "High-Speed Optical Wafer Prealigner", Jun. 1994, 1 page.
Star Linear Systems, Product Brochure, "Linear Modules with Integral STAR Ball Rail Systems", Jul. 1992, 5 pages.

*Primary Examiner*—Vinh P. Nguyen
*Attorney, Agent, or Firm*—William B. Walker

[57] ABSTRACT

A tester for testing integrated circuits-containing semiconductor wafers or substrates, includes a vertically oriented performance board with. D/A converters mounted and pin connected immediately therebehind. A prober including a vertical array of connector pins mounts a vertical probe card and a vertically-mounted chuck on which a vertically-oriented wafer or substrate is held. One of the tester and prober are moved with respect to the other to dock and latch the tester and prober together. Simultaneously the array of connector pins is electrically connected to electrical connectors on the performance board and probe needles extending from a probe board on the probes are placed into test contact with contact pads on the integrated circuits on the wafer or substrate.

17 Claims, 7 Drawing Sheets

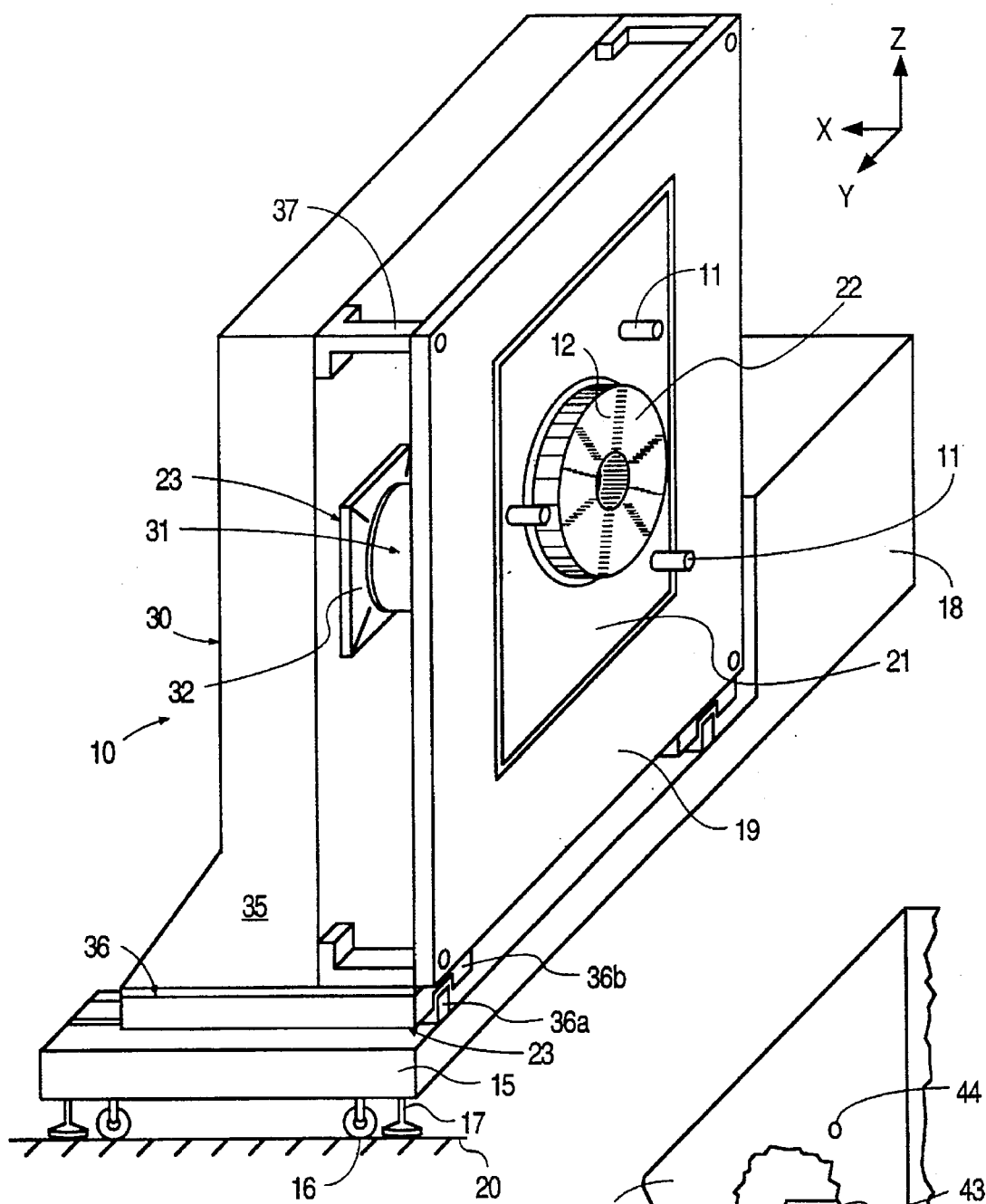
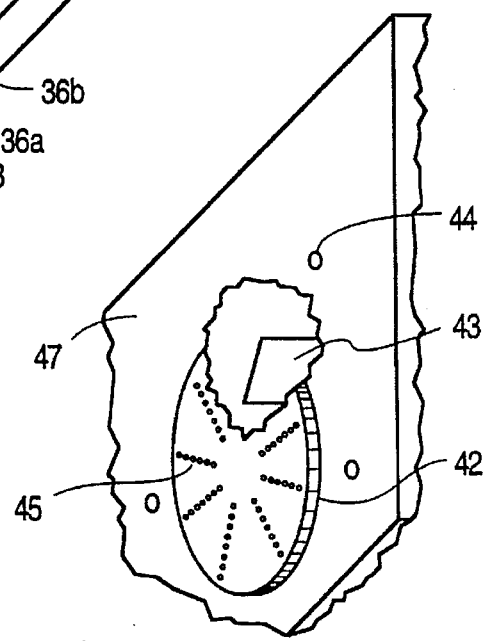
FIG. 3
FIG. 4

PROBER AND TESTER WITH CONTACT INTERFACE FOR INTEGRATED CIRCUITS-CONTAINING WAFER HELD DOCKED IN A VERTICAL PLANE

BACKGROUND OF THE INVENTION

1. Field of the Invention

This invention relates to a prober and tester for testing electrical characteristics of integrated circuits (IC's) which have been fabricated on silicon or other semiconductor wafers or other substrates to determine which IC's are operational. More particularly, the invention is directed to an apparatus which permits testing of a wafer in vertical orientation where a prober can be docked to a tester with required precision and with simplicity.

2. Related Art

Integrated circuits (IC's) are fabricated on silicon wafers and are routinely tested on the wafer to determine which IC's are operational. After testing, the wafer is broken up into individual dies and each operational working die(s) is mounted into a ceramic, plastic or other package with external leads that can be connected to other devices. The operational objective for testing on the wafer, for the IC manufacturers, is to only pay for packaging IC's which are operational i.e. have passed the testing. During testing, IC's which "FAIL" are suitably marked and then discarded prior to packaging of IC's which have "PASSED".

Testing has become progressively more challenging because as individual device geometry in the integrated circuit shrink, the frequency of electrical signals in the device, commonly called clock speed, of the devices increases roughly in proportion. Further, testing at the wafer probes must mimic the final application as closely as possible. As a result, the test equipment also must operate at progressively higher frequencies.

In most recent wafer prober prior art, a test head of a tester is mounted on a head plate of the wafer prober, as typically seen in U.S. Pat. No. 4,517,512. An insert ring is mounted in the head plate. A contact board is disposed on an upper surface of the insert ring with a card socket on the bottom surface. These are connected by cabling and a probe card is attached to the card socket by connector pins or sockets. A test head is positioned over the head plate with a performance board therebetween. The performance board and contact board are connected by connector pins. A chuck with an IC's-containing wafer mounted thereon is positioned below the probe card and needle-like contacts from the probe card contact predetermined bonding pads on each IC.

A major problem in mimicking the final application in test is that, in the final application, the packaged IC's are mounted a few millimeters apart connected by fine copper lines on a printed circuit board. In test, the connection to the IC must be made from a test computer that generates the logic test patterns, to D/A (digital-to-analog) converters that convert the logic signals to an electrical signal that varies in time, through a set of interconnections, typically cables, to a probe card, and finally to the IC. In traditional test configurations, a cable extends from the probe card positioned above a wafer to a tester cabinet containing the D/A converters. In U.S. Pat. No. 4,517,512 the D/A converters are mounted on the probe card of a test head and cabling extends from D/A converters to the tester. The probe card comprises a set of probe needles arranged to make contact with the pads on the integrated circuit. The system is designed in this way so that specific test conditions can be generated on the host computer under software control. The tester must exercise the chip through as many sets of conditions as possible.

The actual testing process uses both a tester and a prober. A prober, as made by Electroglas Inc., Santa Clara, Calif. as model number 4080 or 4085, is a machine that moves the wafer around underneath a probe card, and probes ICs on a horizontally oriented wafer by making repetitive contacts between numbers of small pads on each IC and the probe needles. A similar system is seen in U.S. Pat. No. 5,172,053. The base of the prober contains electronics, a ring carrier consisting of a metal plate with a hole for a probe card, the ring carrier being mounted to the base by screws into a series of posts. The probe card is mounted in the hole in the ring carrier. The wafer is held on an XY stage chuck more particularly on the chuck top via a set of vacuum rings. The chuck top is mounted, using screws to a Z/theta stage, that can move vertically and in rotation using stepper motors coupled to lead screws as seen in U.S. Pat. No. 4,066,943. The Z stage also has vacuum pins that are used to transfer wafers as will be described later. The Z/theta stage is mounted to an XY stage, and the Z/theta stage is used to force the probe needles into contact with the pads on each successive IC. Every IC on the wafer can be tested. As used by Electroglas, the Z/theta stage can be a ball bearing assembly as described in U.S. Pat. No. 5,344,238 and sold as Electroglas Model #PZ7, and the XY motor can be a linear stepper motor as described in U.S. Pat. No. 3,940,676. There is often a robot added to the prober to automatically remove wafers from a cassette and load them on the chuck top as in Electroglas model 4080 and 4085.

The earliest tester connections in prior devices were made from D/A converters buried in the tester, through a series of cables running from the tester to the prober. As the test frequencies became higher the length of the cables from the D/A converters and the probe card limited the maximum test frequency. One solution as taught in U.S. Pat. No. 4,517,512 was to place the D/A converters in a test head directly over the prober and then make a very short cable connections to the probe card. These cables carry less current and therefore allow higher frequency testing than the original cables to the probe card shown in prior devices.

There are a number of practical constraints that affect the length of cable and type of connections that can be used.

1) The tester must be able to connect to probers as described above and other types of machines that handle packaged IC's or be used for manual loaded individual packaged IC testing.

2) There are no common interface height and position standards.

3) The prober may be moved between different testers, and must be available for maintenance. Maintenance or adjustment may include the Z, X, and Y stages. In order to make consistent contact, the chuck top must be level with respect to the horizontal XY motion, and the probe card needles must be leveled with respect to the chuck top. The adjustment is usually provided by compression of pads underneath the chuck top or beneath the Z stage by mounting screws or adding thin strips of metal or "shimming". Ring carrier screws mounted at the corners of the ring carrier provide leveling of the probe card.

4) The D/A converters must be available for maintenance. The D/A converters may require adjustment or replacement.

5) The test head must be docked to the prober or make electrical connection between the D/A converters and the probe card. The outside surface of the performance board typically consists of radial connector points. The top surface of the probe card consists of a matching set of connector pads. Electrical contact is achieved using a connector pin ring. The connector pins are miniature compressible connectors that are typically of two-piece construction with an internal spring so multiple contact can be made between two uneven surfaces. A more complex structure with the same operational objective is taught in U.S. Pat. No 5,187,431 where the connector pins are typically held in a plastic ring that is mounted to the top of the ring carrier.

When the performance board is brought into contact with the connector pins, the radial contact points must be aligned with the connector pins. This is achieved using mechanical keys such as a pin that mates with a hole in the test head. This procedure is commonly called docking. The contact points are 1–2 mm in diameter, so this defines the docking accuracy requirement.

There are additional complex interfaces with additional layers and using connectors other than connector pins, as taught in U.S. Pat. No. 5,329,226. However, there remains a general need to accurately dock the test head with the prober. In all cases the test head is provided with the mechanical freedom in all axes to be moved to align to the prober.

A test head can be as large as 91 cm in diameter, and weighs 227 Kg. They contain a large collection of very high performance D/A converters to generate the signals. These test heads have become progressively larger, more unwieldy, needing their own manipulator to move them around and change their orientation. Manipulators are described in U.S. Pat. No. 5,241,870. The test head, manipulator and cables take up more and more costly facility space. Some manufacturers have gone to the extreme of erecting a gantry over the prober in order to move the test head around without using up floor space.

The test frequencies have increased by at least a factor of 10 since the introduction of modern test heads. The tester to D/A converter cables have now become a factor again in test frequency. There is thus a need for a more cost effective solution to providing a very high speed tester interface.

Kensington Laboratories, Inc. of Richmond, Calif. has developed a wafer inspection and defect review station in which a microscope is mounted to inspect a vertically mounted and insertable wafer semiconductor.

SUMMARY OF THE INVENTION

In accord with one aspect of this invention, a prober and tester is provided which allows the critical D/A converters to be built into the tester providing short connection paths from tester control to the D/A converters and to the device under test. The short connections are a key requirement for high frequency testing.

Further, the invention includes having the test head of the tester and the test head performance board mounted vertically with the D/A converters behind the performance board. Likewise, a prober is provided including a base with a YZ stage assembly which is capable of horizontal travel in an X direction, travelling on linear bearings. The stage assembly is vertically oriented so that the overall prober travels horizontally into docking relationship with a vertically-oriented test head of the tester. To dock the prober to the tester, the prober is rolled horizontally into rough alignment with the tester and a rough Z height alignment performed. The YZ stage assembly is then moved in the X direction on linear bearings driven by a manually operated or motor driven lead screw. Alignment pins on the prober engage holes in the tester and a ring carrier substage moves in Y and Z directions to align connector pins mounted in a probe card to contact points on the performance board. When the stage completes a relative motion toward the tester and is latched, the prober is docked vertically flush to the front of the tester so that the performance board and the probe card make electrical contact through a connector pin assembly. Thus a highly compact interface for very high speed testing is provided.

Advantages of the above arrangements are:

1) The D/A converters can be mounted in the tester minimizing the range of motion required in the D/A converter assemblies and reducing cable lengths or eliminating the need for external cable completely by replacing all cabling by pin connectors. The result will be a significantly higher speed electrical interface.

2) The footprint of the prober and tester combination will be greatly reduced compared to a conventional test head solutions. This will be a particular advantage as the wafer size and probes become larger in the future.

An important element of this invention is the movement of the ring carrier substage in the ring carrier which permits the ring carrier substage relatively free motion in the plane of wafer motion (Y and Z) while allowing very little motion orthogonal to the wafer motion (X) so that the probe needles remain level with the wafer. The wafer is mounted on the chuck top.

The apparatus of the invention has a tester including a test head having a vertically oriented performance board which has electrical connectors or contact points freely accessible from one vertical surface of the tester; a prober including a vertical array of connector pins adapted to be connected to the electrical connectors of the tester, a vertical probe card mounting a series of probe needles and an adjustable vertically-mounted chuck vertically mounting an integrated circuits-containing semiconductor wafer, each of the integrated circuits containing contact pads; and wherein at least one of said tester and said prober are movable along a horizontal path with respect to each other to latch and dock the tester and prober together, while electrically connecting selected ones of the connector pins to selected ones of the electrical connectors and the probe needles to the wafer contact pads.

BRIEF DESCRIPTION OF THE DRAWINGS

FIG. 3 is a schematic perspective view of the prober showing the connector pin array end.

FIG. 4 is a schematic perspective partial view of the tester showing an exposed performance board cutaway to show the location of the D/A converters.

DETAILED DESCRIPTION

The present invention is described below with reference to the accompanying drawings.

Figure 1:
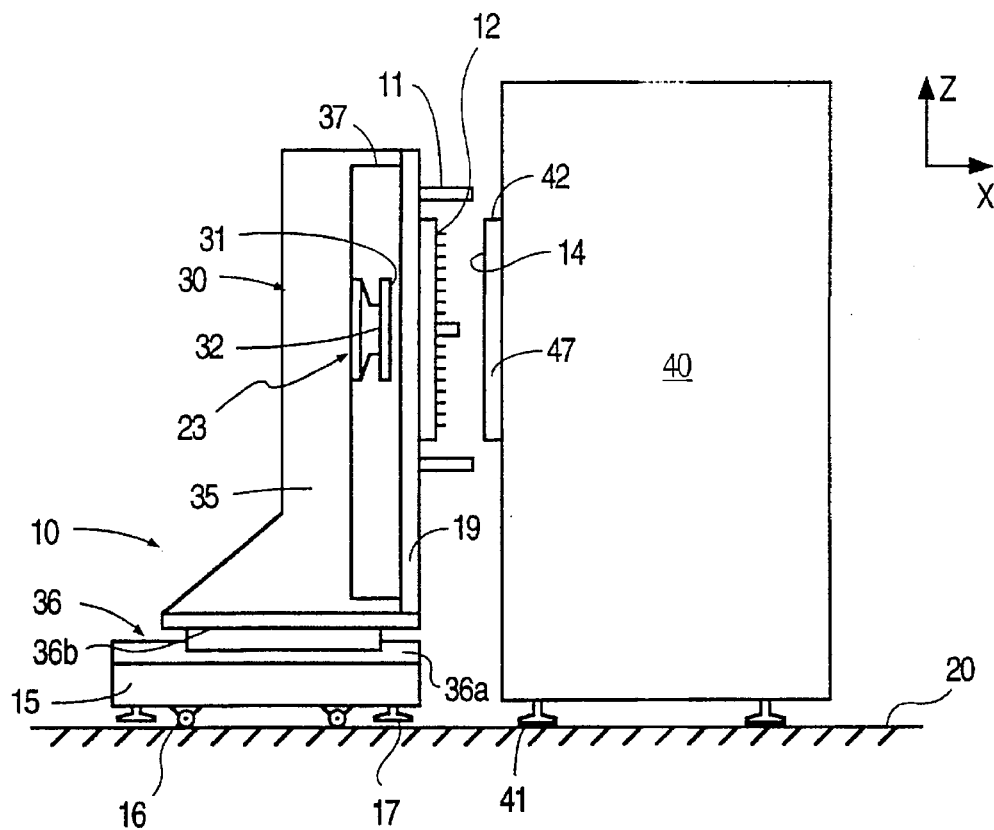
FIG. 1 is schematic side view of a vertically-oriented prober prior to docking with a vertically-oriented tester.

FIG. 1 shows a prober 10 including a base 15 and vertical wall 35, with a YZ stage assembly 30 movably mounted on the wall and traveling on linear bearings 36, including a rail 36a and a rollers-containing cap 6b, with travel in the X direction that provides part of a docking function. An example of an appropriate linear bearing are crossed roller ways IKO #CRWU-60/205 made by Nippon Precision of Gifu, Japan and are used with an approximate travel of 100 mm. Equivalent products are made by Del-Tron Precision of Bethel, Conn., the bearings as'seen more clearly in FIG. 7. The YZ stage assembly 30 comprises a chuck 32, a YZ stage 23 with linear bearings 36, and a ring carrier 19. The ring carrier may be mounted to corner posts 37 extending from the prober vertical wall 35. As in the previous examples of a conventional prober, the wafer is held on a chuck top 31 typically by vacuum. The chuck 32 is mounted to the YZ stage. A vertical array 22 of horizontal connector pins, such as pogo pins, is mounted over a probe card (hidden) in the ring carrier 19. Within the ring carrier is a substage 21 (FIG. 3) On the substage are mounted three alignment pins 11. The substage 21 is mounted in such a way as to provide from about 2 to about 5 cm of YZ motion to allow fine alignment of the prober 10 to a tester 40 as the alignment pins slide into the alignment holes 44 (FIG. 4) in the tester 40.

Figure 13:
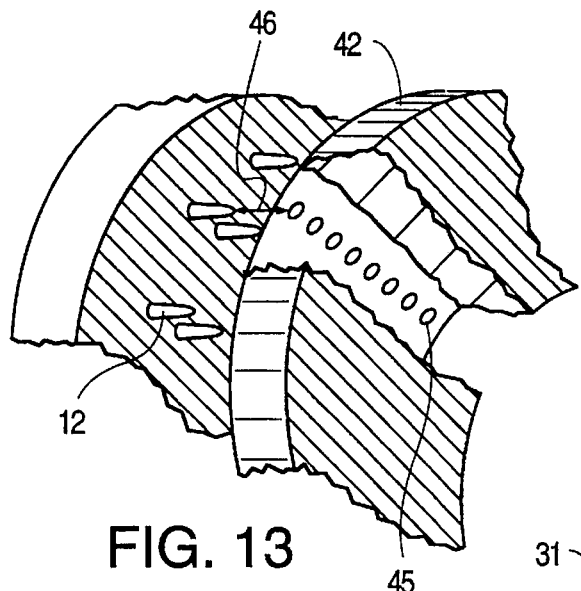
FIG. 13 is a schematic partially cutaway perspective view of a tester performance board and connector pins extending from a connector pin ring usable in the prober of FIG. 1.

To dock the prober 10 to the tester 40, the prober is rolled into rough alignment on casters 16. An example of a suitable unit is made by Caster Technology Corp. Union City Calif. Model #75, and a set of fixed feet 17 are lowered to a fixed horizontal floor surface 20 on which the prober rolls. An example of a suitable foot unit is made by Vlier of Brighton, Mass., known as the metric stud type. The feet 17 are used to ensure rough Z height alignment. Once the prober is ready for docking as shown in FIG. 1, the YZ stage assembly 30 is moved in the X direction on the linear bearings 36. The alignment pins 11 extending from the prober engage the holes 44 in the tester (FIG. 4). To effect docking, the ring carrier substage 21 moves in Y and Z, for example, by the flexibility of rubber plugs between the substage and the ring carrier (FIGS. 5/6), to align all the horizontal connector pins 12 in the array 22 to electrical connectors or contact points 45 on the performance board 42 (as shown by arrow 46) of the tester 40 at the interface 14 (FIG. 13). The prober has a pivotable latching arm 96 (FIG. 14) in the ring carrier 19 which latches with a latch keeper 97 attached to the tester to effect completed docking.

Figure 15:
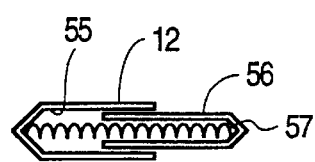
FIG. 15 is a cross-sectional view of a connector pin.

FIG. 13 illustrates the contacting of horizontal connector pins 12 which upon docking and undocking (arrow 46) contact and disengage, respectively, from contact points 45 on the performance board 42. FIG. 15 shows a typical connector pin 12 comprising a first cylindrical, closed-end shell 55, an inner cylindrical, closed end shell 56 telescoped therein, and a spring 57 extending in the interior of the shells between the closed ends.

Figure 14:
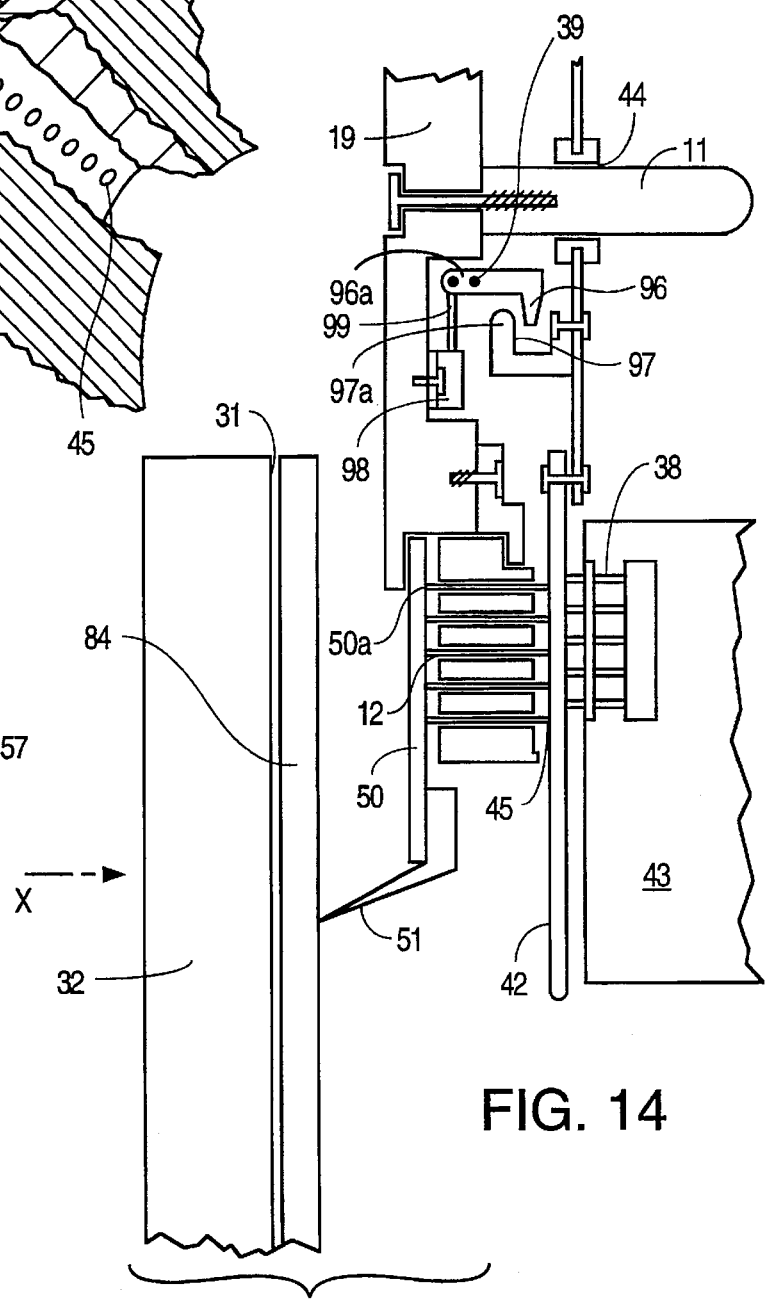
FIG. 14 is a schematic side view showing a needle connection from the connector pin ring to the wafer.

FIG. 14 illustrates the details of interface 14, where connector pin array 22 makes contact with the performance board 42. Latching is provided by the ring carrier 19 pivotally mounting (by pin 39) one end 96a of a pivoted latch arm 96. The arm 96 rides up an outward surface 97a of a latch keeper 97 mounted to the performance board, as the carrier moves into latching engagement to engage the latch arm 96 with the keeper 97. Unlatching, after test, is accomplished by operation of a hydraulic cylinder 98 having a piston rod 99, pin attached to the end 96a of the arm 96, for pivoting the arm 96 out of the keeper 97 by a downward stroke of the piston rod. A second set of connector pins positioned in an array 38, connect the appropriate contact points 45 of the performance board 42 through plated-through holes (not shown) therein, directly to an edge connector on one or more D/A converters 43. Thus no cabling is required.

The probe needles 51 may be of conventional or other construction, such as membrane probe cards supplied by Probe Tech of Santa Clara, Calif. The needles extend from probe card 50 to contact the IC contact pads on a wafer 84 mounted on the chuck top 31. A slight gap is shown between the chuck top and wafer so as to more clearly show the two parts. The probe card is mounted in the hole in the ring carrier. The wafer is held on an XY stage chuck more particularly on the chuck top via a set of vacuum rings. The chuck top is mounted, using screws, to a X/theta stage that can move in X and in rotation using stepper motors coupled to lead screws as seen in U.S. Pat. No. 4,066,943. The X stage also has vacuum pins that are used to transfer wafers. The X/theta stage is mounted to the YZ stage 32, and the X/theta stage is used to force the probe needles into contact with the pads on each successive IC. Every IC on the wafer can be tested.

While the connector pin assembly 22 is shown in FIG. 14 as connected to the ring carrier substrate 21, the assembly may be connected to the performance board 42. Likewise, while FIGS. 3 and 14 show the substage as being used for the fine alignment, it is contemplated that the performance board and the D/A converters may be mounted so as to be movable in the YZ direction by a small amount i.e, about 2-5 cm., to provide the fine alignment of the connector pin assembly to the probes.

The complete prober tester interface thus comprises four major assemblies namely, the tester 40, the prober 10, the probe card 50 and the horizontal connector assembly 22. The probe card is mounted in the ring carrier 19. The horizontal connector pin array is also mounted in the ring carrier, so that the horizontal connector pins 12 align with connection points 50a on the probe card 50. Finally during docking the connector pins 12 are aligned with the corresponding contact points 45 on the performance board 42 of the tester. During probing, the needles 51 of the probe card are forced into contact with contact pads on integrated circuits on the wafer 84. Electrical signals pass from the tester through the performance board, through the horizontal connecting pins, through the probe card, down the needles to the IC on the wafer. This enables the electrical properties of the IC to be tested.

While the invention has been described in terms of the prober being moved into the tester horizontally, the tester unit 40 can be moved or both units may move into latching condition or one of the units may pivot on a vertical axis to close (like a door) on the other unit.

When the YZ stage assembly 30 is moved forward and docked flush (FIG. 2) to the front of the tester at the interface 14, the performance board 42 and the connector pins 12 in the connector pin array 22 make electrical contact forming a highly compact interface 14 for very high speed testing, i.e. preferably in a range of from about 200 to about 500 megahertz in the case of wafer testing. Base extension 18 (FIG. 3) of the prober 10 is designed to mount a robotic loading assembly including a wafer cassette as described with respect to FIG. 12.

The D/A converters take the digital commands from the tester and convert them to analog signals that actually drive the electrical circuit under test. The performance of the electrical connections to these boards is a determiner of test performance. The D/A Converters 43 are mounted in the tester (FIG. 4) eliminating the range of motion required in the prior art D/A converter assemblies and reducing cable lengths or eliminating cables completely. The result will be a significantly higher speed electrical interface.

The footprint of the prober and tester combination will be greatly reduced compared to a conventional test head solution. This will be a particular advantage as the wafer size and prober size become larger in the future.

Figure 2:
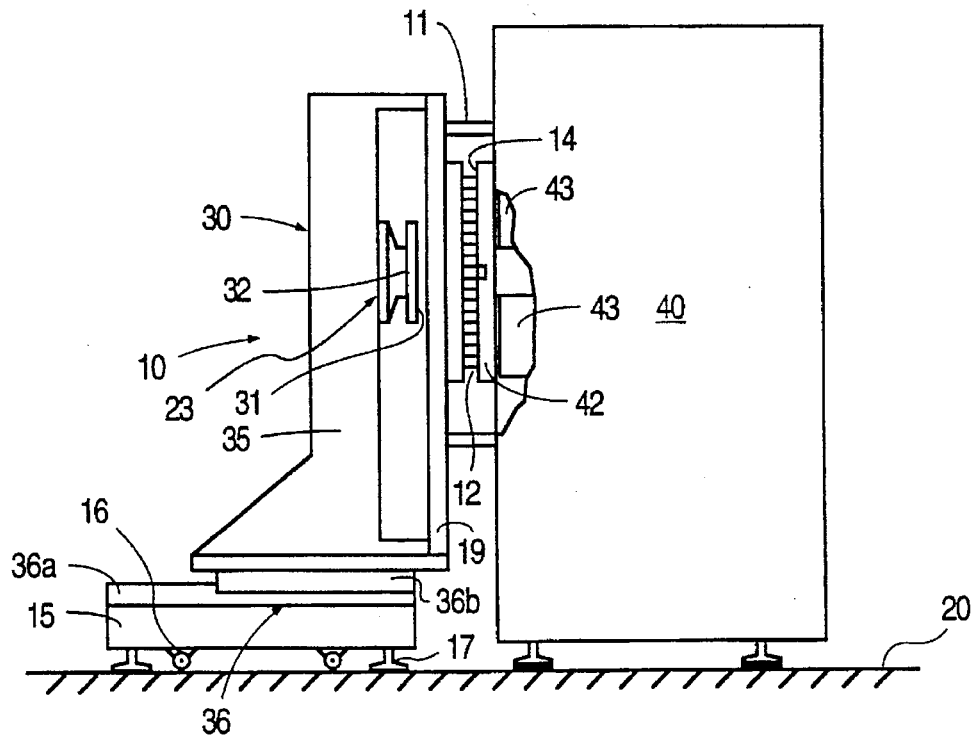
FIG. 2 is a schematic side view therefor, after docking with the tester partially broken away to show the D/A connection internal location.

Performance board 42 is mounted in a vertical plane on a vertical surface 47 of the tester 40. The tester 40 is laterally fixed to floor support surface 20 by feet 41. D/A converters 43 are mounted immediately behind the performance board 42 as seen in FIGS. 2, 4 and 14.

Figure 5:
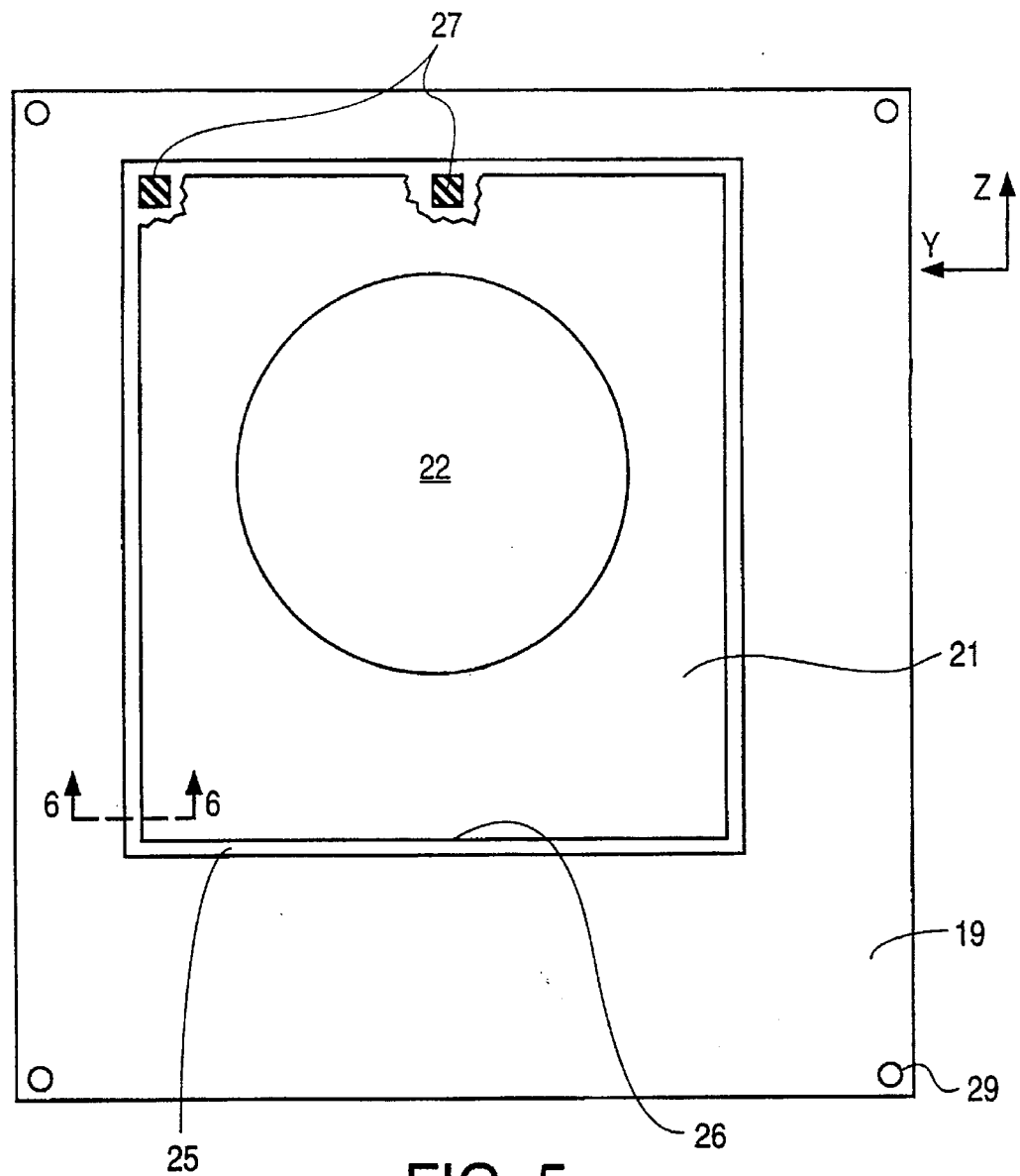
FIG. 5 is a schematic end view of the ring carrier and substage of the tester, cutaway to show a shear bearing connection therebetween.
Figure 6:
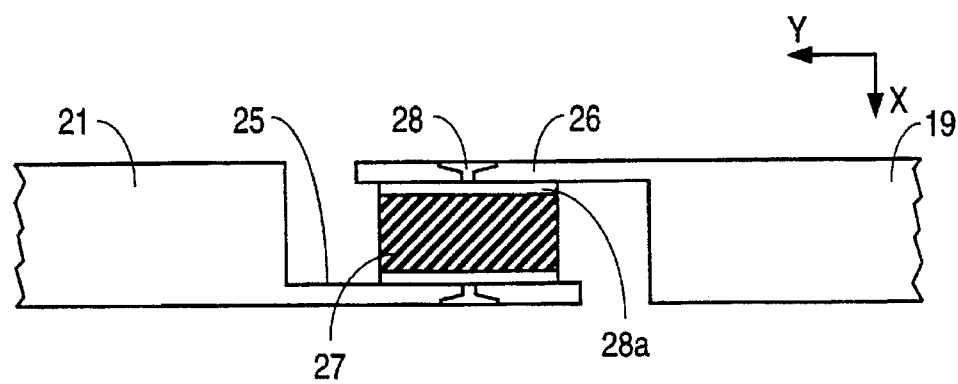
FIG. 6 is a schematic side view of the shear bearing connection taken on lines 6—6 in FIG. 5 and extending between the ring carrier and substage for fine alignment during docking of the prober.

As shown in FIGS. 5 and 6, the ring carrier substage 21 provides relatively free motion in the plane of wafer motion (Y and Z) while allowing very little motion orthogonal to the wafer motion (X) so that the probe needles remain level with the wafer. In a first implementation two overlapping lips 25 and 26 are formed, one on the ring carrier 19 and the other on the substage 21. Rubber plugs 27 are mounted in between the lips, by screws 28 to a metal or plastic plate 28a at the distal ends of the plugs. The rubber plugs are located at several locations around the lips. The number and sizes of the plugs are determined by the forces that are available, and the need to minimize motion in the X direction. For example, eight plugs may be positioned evenly spaced about the periphery of the ring carrier and substage. The typical rubber plug has a very low shear modulus, but a high compression modulus. The rubber plug is constructed of natural rubber having respective moduli of about $10^{-3}$ GPa and about 10 GPa. Motions in the Y and Z directions tend to move the rubber in shear, and in the X direction compress the rubber. The rubber plugs produce a shear bearing with the specific functionality to allow fine alignment during docking of the prober.

Figure 7:
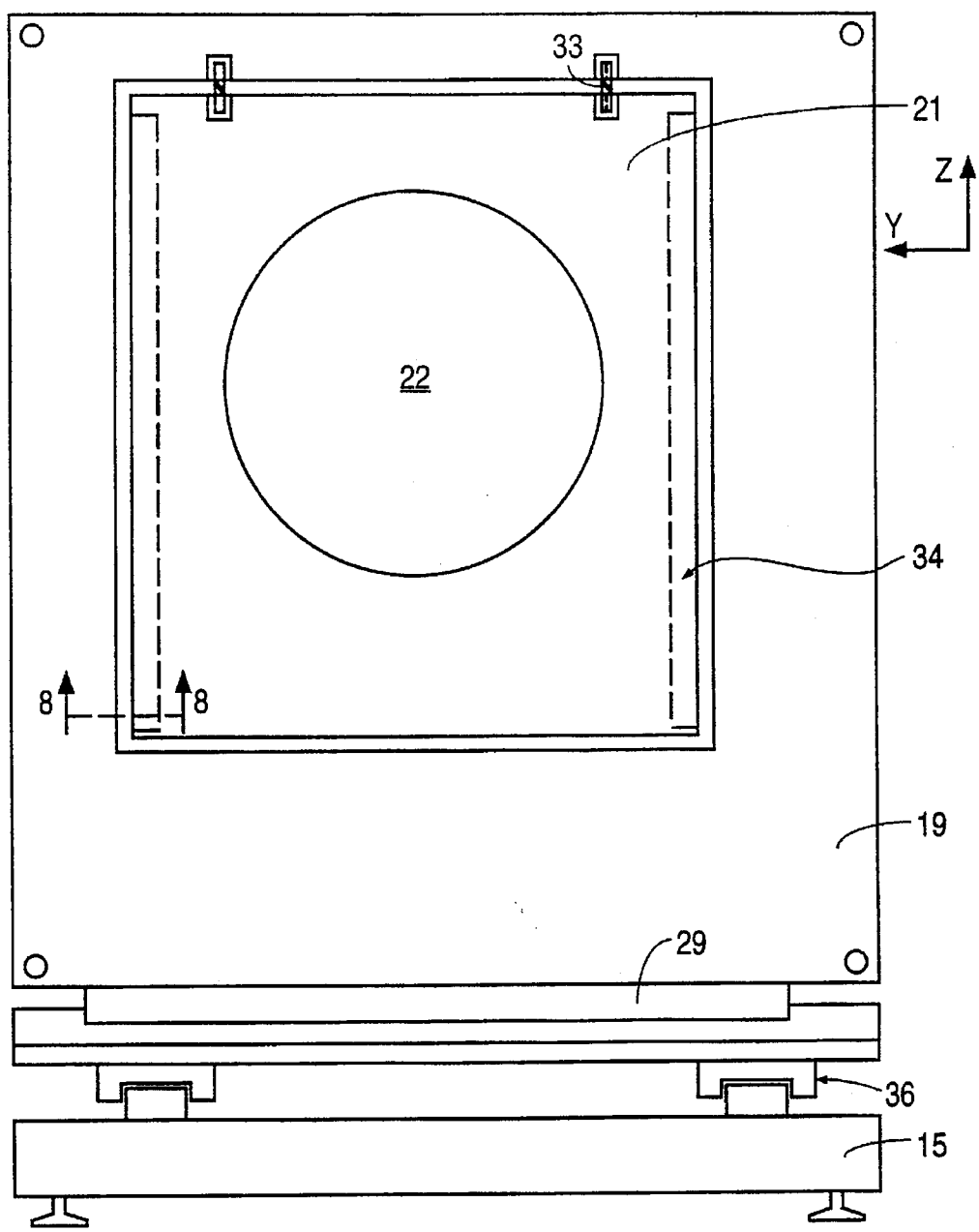
FIG. 7 is a schematic end view of a second embodiment of the ring carrier connection including orthogonal Z and Y axis linear bearings.
Figure 8:
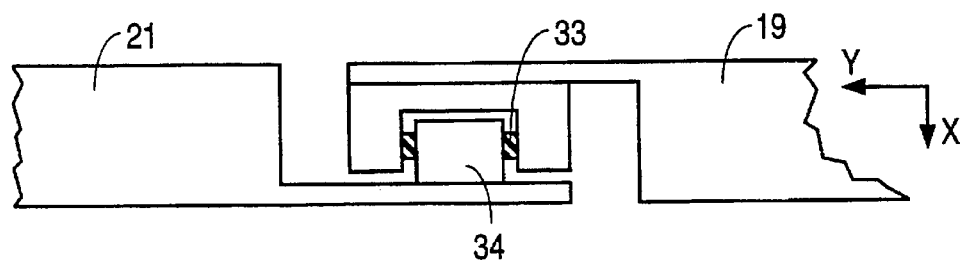
FIG. 8 is a schematic side view thereof taken on the lines 8—8 of FIG. 7.

An alternative assembly shown in FIGS. 7 and 8, that will provide the same functionality shown in FIGS. 5 and 6 uses a second pair of linear bearings 29 under the YZ stage assembly to provide <50 mm of Y motion. The ring carrier substage 21 has a pair of bearings 34 that allows motion in the Z direction. The bearing can be a linear bearing assembly. An example of a suitable bearing is a low profile crossed linear roller bearing made by Del-Tron Precision. The substage is suspended by rubber strips 33. The two pairs of linear bearings 29, 34 provide orthogonal YZ motion for the ring carrier substage and the rubber strips 33 provide a counter force against gravity for the ring carrier substage. Thus substage has an upper suspension provided by the pair of rubber strips.

The assembly in the ring carrier substage could equivalently be used to mount the performance board and D/A converters in the tester. The performance board and D/A converters would then move in Y and Z under the forces of the alignment pins in order to provide fine alignment.

The next operation in making contact from the tester 40 to the wafer 84 mounted on the chuck top 31 is through a probe card 50 mounted in the ring carrier 19. Behind the ring carrier there is the Y-Z stage assembly 30 for moving the wafer mounted on the chuck 31 in the YZ plane in front of the probe card 50 (FIG. 14) and moving the wafer in the X direction into contact with the probe needle 51. After each chip is tested, the wafer is moved in Y and Z to the next chip on the wafer. This is similar to the conventional process described above in the fifth paragraph of Related Art, except that the planes of motion have been changed.

The YZ stage for this application preferably would operate in the vertical plane at high speeds up to 250 mm/sec-1 and accelerations up to 1 G. It provides resistance to large forces in the X direction perpendicular to the plane of motion of up to 100 kilograms. The forces are generated when up to 2000 probe needles must be forced into contact with the contact pads of an IC or a group of IC's. The YZ stage preferably will move less than 2 microns in the X direction under load.

A conventional YZ stage assembly suitable for this application consists of two linked linear motors in one axis and one in the other axis, in the form of an H bridge. The stage rides on the arm of the H bridge as in New England Assoc. Model OFS. A system that uses lead screws to move a stage supported on air bearings is taught in U.S. Pat. No. 4,677,649. DC servo motors and air bearings can be used as in the Dover Instruments Model XH stage. A vertical lead screw-based stage is also described in U.S. Pat. No. 5,241,183.

The drawback to such a bridge system is that the force orthogonal to the plane of motion of the stage from compression of the probe needles must be supported by the H bridge. Also any twisting loads in acceleration or deceleration must be resisted by the H bridge bearings. Finally, the motion flatness must be provided by the entire H assembly. If the orthogonal force is much greater than the motion load, then the H bridge must be strengthened to support the force alone.

In a motor operating in a horizontal plane, the load can ride on an air bearing on a controlling flat surface to provide very flat motion, or to provide resistance to orthogonal loads (U.S. Pat. No. 5,040,431). A complex vertical stage with an air bearing reference plane and two linked stages is described in U.S. Pat. No. 5,285,142 for aligning a wafer in a microlithography system. An air bearing system using a single stage cannot operate successfully in a vertical plane since there is no gravity to compress the air bearing.

Figure 9:
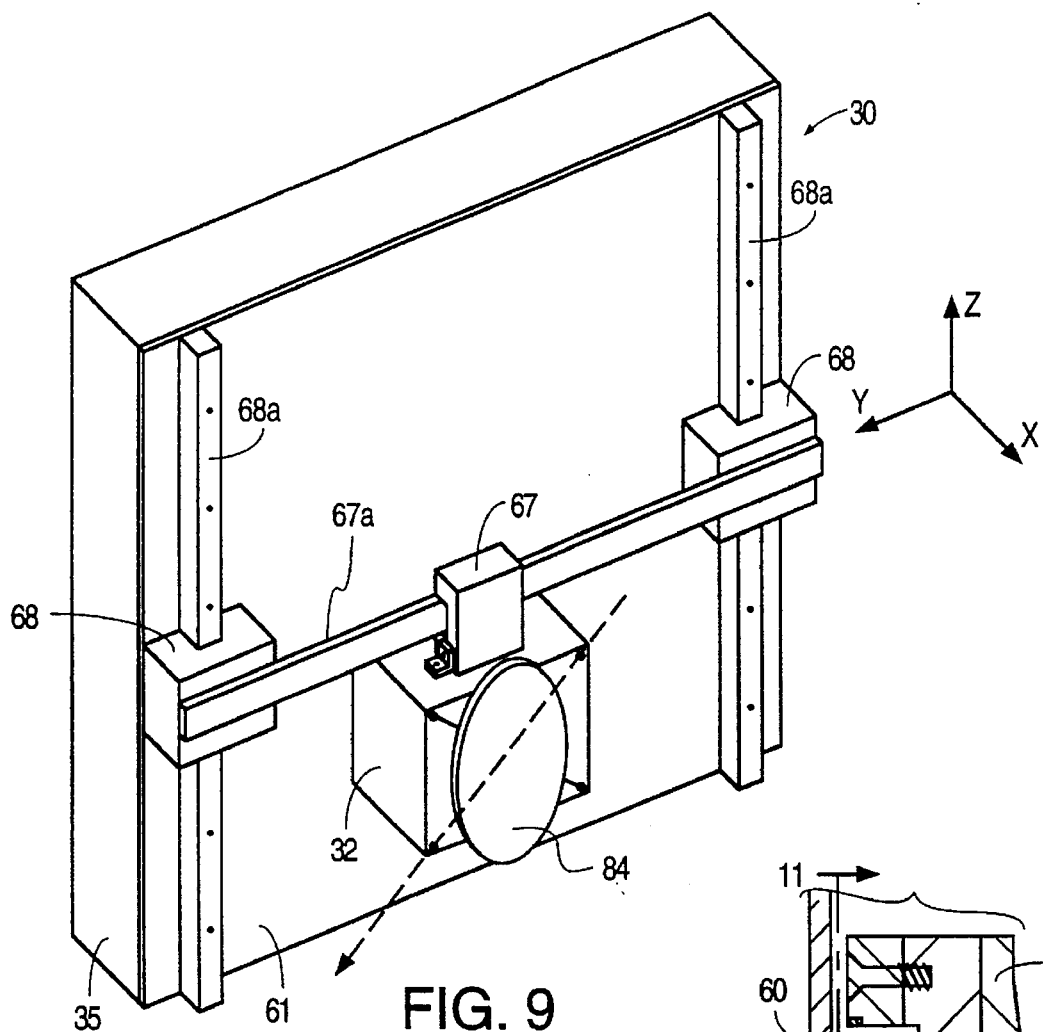
FIG. 9 is a schematic perspective view of the stage chuck, a wafer mounted thereon and a stage X-Y linear drive.
Figure 11:
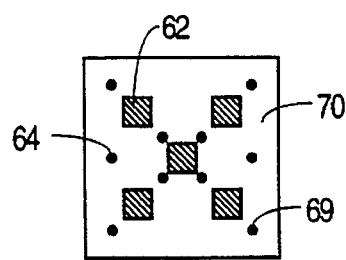
FIG. 11 is a schematic side view thereof taken on the line 11—11 of FIG. 10.
Figure 10:
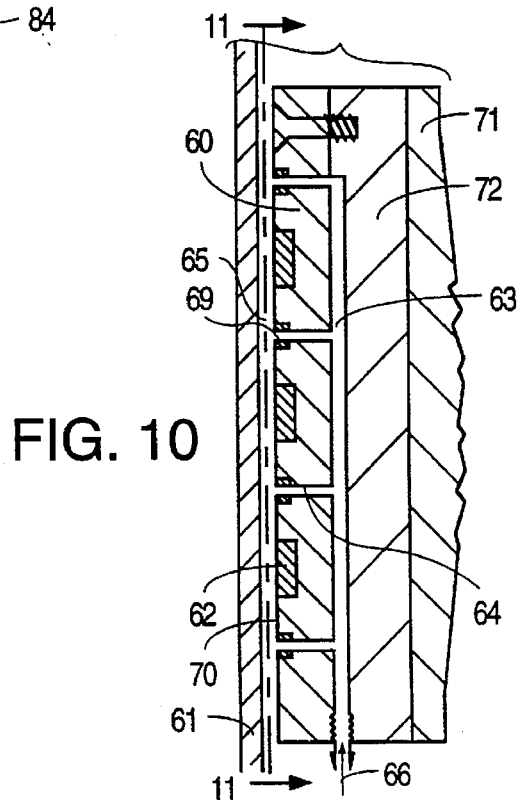
FIG. 10 is a schematic cross-sectional view of a magnetic air bearing usable in the FIG. 9 stage.

FIGS. 9–11 illustrate a stage assembly that is particularly effective for a stage assembly operable in the vertical plane with resistance to orthogonal loads and twisting loads. The stage assembly includes a magnetically preloaded air bearing stage. As shown in FIG. 10, the stage 32 contains air passages 63 between a stage intermediate member 72 and a stage base 60 and air passages 64 in stage base 60 for introduction of compressed air (arrow 66), and permanent magnets 62 mounted in the stage base 60. A stage cover 71 containing chuck top 31 is screw connected to stage intermediate member 72. The XY stage assembly 30 is attached to a linear drive system 67 that moves the stage assembly in one (Y) direction on bar 67a (FIG. 9). The bar 67a that supports the Y drive is connected to two linear drive systems 68 that move the stage in Z along bars 68a. These linear drive systems can include encoders (not shown) for accurate motion, and can have an air or linear ball bearing support and a linear stepper motor, linear DC servo motors, ball screw or lead screw drives. The most effective solution is an air bearing-supported DC servo motor available from Dover Instruments, for example Model ES-600-S-250-CLS.

The base of the stage assembly more particularly the wall 35 is covered by a sheet of ferromagnetic material 61 such as iron or steel. The layout of the bottom of the stage base 60 is a regular pattern of magnets 62 and air nozzles 69. The permanent magnets attract the magnetic sheet, and the compressed air floats the stage on a magnetically preloaded air bearing formed in gap 65. The compressed air is supplied to passage 63 through a hose in an umbilical (not shown) that also carries drive signals to and from the Y linear drive. The use of the magnets 62 allows the stage to operate in any plane, even upside down. The use of a magnetic preload also minimizes the compression of the air bearing under load. The preload on the air bearing is set by the number and strength of the magnets. Magnets such as rate earth cobalt magnets such as M30,779 available from Edwards Scientific of Barrington, N.J. may be employed. Previous developments have used magnetic air bearings as a integral element of a motor, such as taught in U.S. Pat. No. 3,940,676 or a DC servo motor running over a platen containing permanent magnets (U.S. Pat. No. 4,654,571 and U.S. Pat. No. 4,752,286). The present invention thus preferably uses a novel simple, magnetically constrained air bearing solely for resistance to orthogonal and twisting loads in a low cost, high accuracy long travel stage.

An alternative implementation would be to use a two axis motor as the stage as described in U.S. Pat. No. 4,654,571. The motor is physically linked to an H bar mechanism. Linear motion encoders would replace the linear Y and Z motors. The combination of these elements provides a motor with drive elements close to the center of gravity of the load which minimizes twisting loads. Low cost encoding of the motion provides high accuracy, and automatic alignment of the stepper motor with the steps in the platen. The requirement for alignment is shown in U.S. Pat. No. 3,940,676. Alignment is currently a manual operation in a conventional motor as used in the Electroglas prober Models 4080 and 4085.

Figure 12:
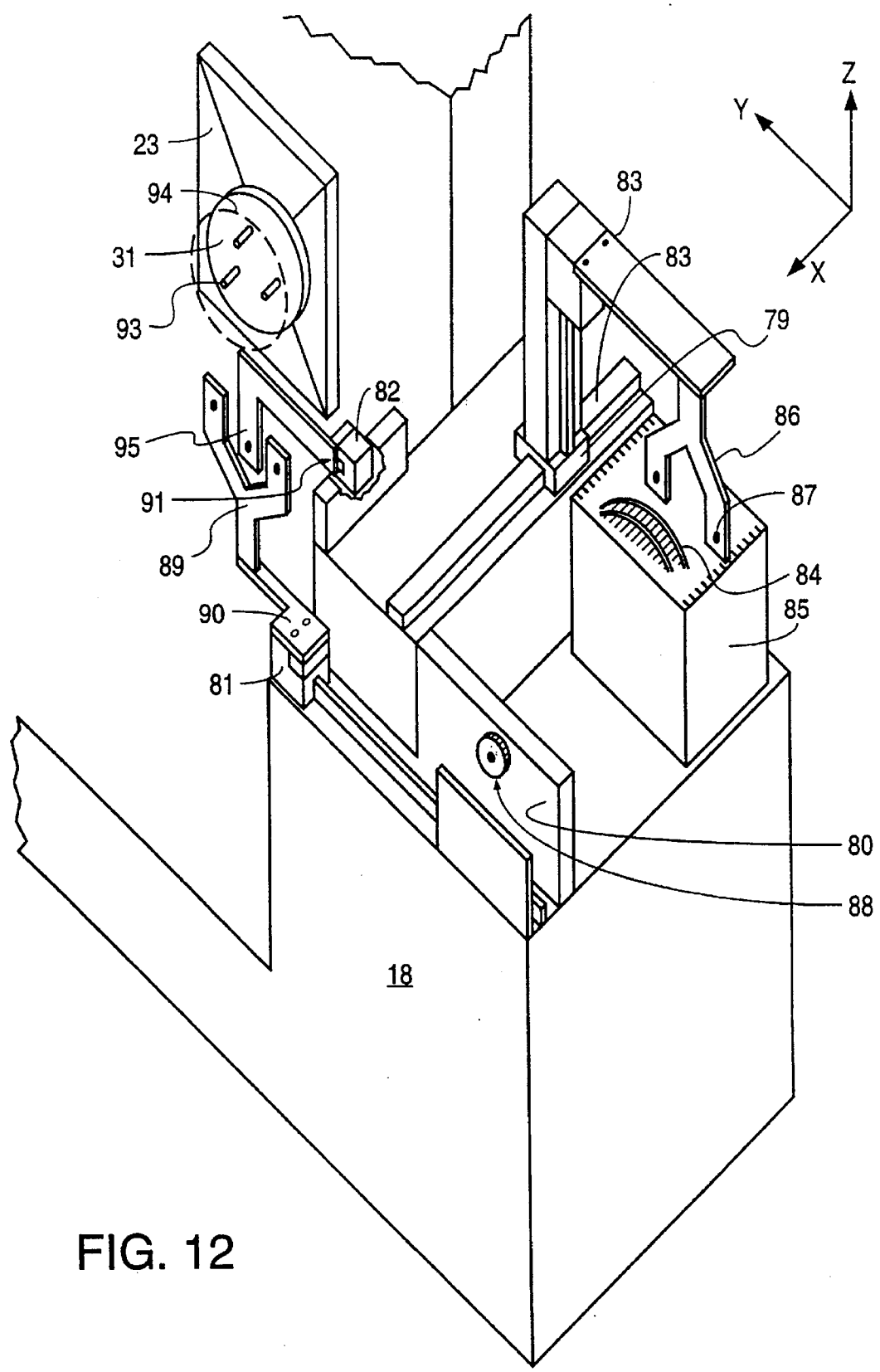
FIG. 12 is a schematic perspective partial view of the prober including an associated robotic system for transferring IC's-containing wafers from a wafer-holding cassette to interface with a vertically oriented chuck.

In addition to having a docking mechanism, a ring carrier and a YZ stage, the system includes a means for automatically loading ahd unloading wafers. There are commercial systems available such as the robot system used in the Kensington Laboratory Ergonomic Vertical wafer/FPD inspection tool. A custom robot system shown in FIG. 12 provides the functionality in the smallest footprint including an XZ robot 79, a prealign station 80, a Y axis transfer robot 81, and a buffer station 82. The XZ robot includes two linear motion systems 83 such as those made by STAR LINEAR SYSTEMS. These motion systems use either a ball screw or a belt drive to move a table in a ball rail system. The XZ robot picks up a wafer 84 from a cassette 85 by moving down in Z and then forward in X. The wand 86 is thin enough to pass between wafers in the cassette. Vacuum holes 87 in the front of the wand are connected through passages in the wand to a port (not shown) connected to a vacuum source. Vacuum pick up systems like this are standard in the wafer robot industry and are used by Kensington Laboratories. When the wand is in contact with the wafer, the vacuum is turned on so the wafer is securely held. The XZ robot moves up in Z and forward in X to the front of the prober. It then moves down and back to deposit the wafer on the prealign chuck 88. The prealign chuck has a vacuum hole and connections similar to the wand. The prealign chuck or station is a common device used to find the center of the wafer and orientation of the wafer through mechanical keys such as a notch. Stations for this purpose are sold by Kensington Laboratories under the designation High Speed Optical Wafer Prealigner or a Non-contact Wafer Prealigner by ADE of Newton, Mass. Models PA-408/428. Typically these systems use the wafer to shadow mask a light source onto an array of detectors.

Once the wafer center and orientation have been found, the wafer is rotated to the desired orientation and the transfer robot wand 89 moves forward to pick the wafer from the prealign station. The transfer robot is placed behind the prealign chuck before a wafer is placed on the prealign chuck. The X motion for the transfer robot wand is provided by a small motorized stage 90 with approximately 1 cm travel oriented in the X direction, mounted to the linear motion table. An example of a suitable stage, would be a NEWPORT of Irvine, Calif., Model 433 with 850A-05-HS motor. The transfer robot wand also has vacuum holes similar to the XZ robot wand. The transfer robot can be another linear motion system as supplied by STAR LINEAR SYSTEMS of Charlotte, N.C. or equivalent.

If this is the first wafer of a new cassette, transfer robot wand is moved in the Y direction until it is over the YZ stage 23. The chuck top 31 in the YZ stage is moved in X until the vacuum pins 93 are exposed. The transfer robot arm moves in X until vacuum is pulled on the pins and the wafer is held, the wafer is shown in outline 94. Vacuum is released on the transfer robot, and the YZ stage moves up in Z so the chuck top clears the wand. The chuck top is then raised to support the wafer and the wafer is ready for probing. The transfer robot is then moved in Y back to the prealign station, ready for the next wafer.

Once the wafer on the chuck top is completely tested, the chuck top retracts, so that the wafer is supported on the pins. The YZ stage moves the wafer over a buffer arm 95 that also has a vacuum hole. The buffer arm moves on a small travel stage 91, similar to the one on the transfer robot, in the X direction to pick up the wafer. Now the transfer arm moves the next wafer over the YZ stage and transfers the wafer as described above. After the YZ stage has moved away, the buffer arm moves back and/or the transfer robot moves forward to transfer the wafer back onto the transfer robot. The transfer robot moves back to the prealign station where the XY robot picks up the wafer and returns it to the cassette.

Wands are selected to work together to accomplish the goal. There are many other possible sizes and shapes that could be used. The essential functionality is to pick up a wafer, prealign it, and load it onto the YZ stage with a minimum delay.

Where the invention is described in terms of a chuck-mounted wafer, the chuck may mount a glass or other material substrate having electronic circuits thereon, such as active matrix liquid crystal displays, including contact pads which are to be probed for test purposes. Thus the term "wafer" as used herein includes such substrates.

The above description of embodiments of this invention is intended to be illustrative and not limiting. Other embodiments of this invention will be obvious to those skilled in the art in view of the above disclosure.

We claim:

1. Apparatus for testing semiconductor wafers containing integrated circuits comprising:

a tester having a vertically oriented performance board fixedly positioned with respect to the tester, said performance board including electrical connectors freely accessible from a vertical surface of the tester;

a prober including a vertical array of horizontal connector pins adapted to be connected to the electrical connectors of said tester, a vertical probe card mounting a series of probe needles and an adjustable vertically-mounted chuck vertically mounting a semiconductor wafer containing integrated circuits, each of said integrated circuits containing contact pads, said chuck and mounted wafer being movable with respect to said probe card;

wherein at least one of said tester and said prober are movable along a fixed horizontal path with respect to each other to dock said tester and prober together to electrically connect selected ones of said vertical array of horizontal connector pins to selected ones of said electrical connectors and to said probe needles; and wherein movement of said chuck and mounted wafer makes an electrical contact between said contact pads and said probe needles.

2. The apparatus of claim 1 wherein said prober includes a base and said chuck is attached to a YZ stage assembly, said base travelling in an X direction to dock with said tester.

3. The apparatus of claim 2 wherein said base includes a set of roller casters and wherein said prober is rolled on said casters into rough alignment with said tester.

4. The apparatus of claim 3 in which said base includes a set of adjustable feet, said feet being adapted to be lowered to a fixed support surface for a Z height rough alignment with said tester.

5. The apparatus of claim 2 wherein said YZ stage assembly is actuatable to align said vertical array of horizontal connector pins to said electrical connectors and actuatable in an X direction to contact said probe needles to said contact pads of a first integrated circuit and successively to contact pads of other integrated circuits on said mounted wafer.

6. Apparatus for testing semiconductor wafers containing integrated circuits comprising:

a tester having a vertically oriented performance board fixedly positioned with respect to the tester, said performance board including electrical connectors freely accessible from a vertical surface of the tester;

a prober including a vertical array of horizontal connector pins adapted to be connected to the electrical connectors of said tester, a vertical probe card mounting a series of probe needles and an adjustable vertically-mounted chuck vertically mounting a semiconductor wafer containing integrated circuits, each of said integrated circuits containing contact pads, said chuck and mounted wafer being movable with respect to said probe card; and wherein at least one of said tester and said prober are movable along a fixed horizontal path with respect to each other to dock said tester and prober together to electrically connect selected ones of said vertical array of horizontal connector pins to selected ones of said electrical connectors;

wherein movement of said chuck and mounted wafer makes an electrical contact between said contact pads and said probe needles; and further including at least one D/A converter in said tester, said at least one converter being mounted behind said performance board and electrically connected thereto.

7. Apparatus for testing semiconductor wafers containing integrated circuits comprising:

a tester having a vertically oriented performance board fixedly positioned with respect to the tester, said performance board including electrical connectors freely accessible from a vertical surface of the tester;

a prober including a vertical array of horizontal connector pins adapted to be connected to the electrical connectors of said tester, a vertical probe card mounting a series of probe needles and an adjustable vertically-mounted chuck vertically mounting a semiconductor wafer containing integrated circuits, each of said integrated circuits containing contact pads, said chuck and mounted wafer being movable with respect to said probe card; and wherein at least one of said tester and said prober are movable along a fixed horizontal path with respect to each other to dock said tester and prober together to electrically connect selected ones of said vertical array of horizontal connector pins to selected ones of said electrical connectors;

wherein movement of said chuck and mounted wafer makes an electrical contact between said contact pads and said probe needles;

further including at least one D/A converter in said tester, said at least one converter being mounted behind said performance board and electrically connected thereto; and wherein said at least one converter is connected to said performance board by a second array of connector pins.

8. Apparatus for testing semiconductor wafers containing integrated circuits comprising:

a tester having a vertically oriented performance board fixedly positioned with respect to the tester, said performance board including electrical connectors freely accessible from a vertical surface of the tester;

a prober including a vertical array of horizontal connector pins adapted to be connected to the electrical connectors of said tester, a vertical probe card mounting a series of probe needles and an adjustable vertically-mounted chuck vertically mounting a semiconductor wafer containing integrated circuits, each of said integrated circuits containing contact pads, said chuck end mounted wafer being movable with respect to said probe card; and wherein at least one of said tester and said prober are movable along a fixed horizontal path with respect to each other to dock said tester and prober together to electrically connect selected ones of said vertical array of horizontal connector pins to selected ones of said electrical connectors;

wherein movement of said chuck and mounted wafer makes an electrical contact between said contact pads and said probe needles;

wherein said prober includes a base and said chuck is attached to a YZ stage assembly, said base travelling in an X direction to dock with said tester; and wherein said prober includes a vertical wall mounting a sheet of ferromagnetic material, and wherein said YZ stage assembly comprises a stage base, a pattern of permanent magnets in said stage base, air passages and air nozzles in said stage base and wherein said nozzles are adapted to discharge a supply of compressed air to float the stage base on said sheet as a magnetically preloaded air bearing such that said air bearing resists orthogonal and twisting loads on said vertically-mounted chuck.

9. Apparatus for testing semiconductor wafers containing integrated circuits comprising:

a tester having a vertically oriented performance board fixedly positioned with respect to the tester, said performance board including electrical connectors freely accessible from a vertical surface of the tester;

prober including a vertical array of horizontal connector pins adapted to be connected to the electrical connectors of said tester, a vertical probe card mounting a series of probe needles and an adjustable vertically-mounted chuck vertically mounting a semiconductor wafer containing integrated circuits, each of said integrated circuits containing contact pads, said chuck and mounted wafer being movable with respect to said probe card; and wherein at least one of said tester and said prober are movable along a fixed horizontal path with respect to each other to dock said tester and prober together to electrically connect selected ones of said vertical array of horizontal connector pins to selected ones of said electrical connectors;

wherein movement of said chuck and mounted wafer makes an electrical contact between said contact pads and said probe needles;

wherein said prober includes a base and said chuck is attached to a YZ stage assembly, said base travelling in an X direction to dock with said tester; and wherein said YZ stage assembly comprises a YZ stage and a ring carrier including a substage, and wherein said substage is movable in YZ motion to allow fine alignment of said prober to said tester.

10. The apparatus of claim 9 wherein said substage has free motion in a YZ plane of wafer motion while restricting motion orthogonal to wafer X motion such that the probe needles remain level with respect to a chuck-mounted wafer.

11. The apparatus of claim 10 wherein said substage and said ring carrier include overlapping lips, and wherein a low shear modulus and high compression modulus mechanical connection extends between said lips.

12. The apparatus of claim 11 wherein said mechanical connection comprises a series of rubber plugs.

13. Apparatus for testing semiconductor wafers containing integrated circuits comprising:

a tester having a vertically oriented performance board fixedly positioned with respect to the tester, said performance board including electrical connectors freely accessible from a vertical surface of the tester;

a prober including a vertical array of horizontal connector pins adapted to be connected to the electrical connectors of said tester, a vertical probe card mounting a series of probe needles and an adjustable vertically-mounted chuck vertically mounting a semiconductor wafer containing integrated circuits, each of said integrated circuits containing contact pads, said chuck and mounted wafer being movable with respect to said probe card; and wherein at least one of said tester and said prober are movable along a fixed horizontal path with respect to each other to dock said tester and prober together to electrically connect selected ones of said vertical array of horizontal connector pins to selected ones of said electrical connectors;

wherein movement of said chuck and mounted wafer makes an electrical contact between said contact pads and said probe needles;

wherein said prober includes a base and said chuck is attached to a YZ stage assembly, said base travelling in an X direction to dock with said tester; and wherein said YZ stage assembly has motion in the Y direction and said YZ stage assembly comprises a YZ stage and a ring carrier including a substage, and wherein said substage is movable in Z motion, and wherein the Y motion of the YZ stage assembly and the Z motion of the substage combine to allow fine alignment of said prober to said tester.

14. The apparatus of claim 13 wherein said substage is mounted to said ring carrier, and further including an upper suspension between said ring carrier and said substage including a rubber strip and a pair of linear bearings in a Z axis and a linear bearing on a bottom of the YZ stage for adjustment in the Y axis.

15. Apparatus for testing semiconductor wafers containing integrated circuits comprising:

a tester having a vertically oriented performance board fixedly positioned with respect to the tester, said performance board including electrical connectors freely accessible from a vertical surface of the tester;

a prober including a vertical array of horizontal connector pins adapted to be connected to the electrical connectors of said tester, a vertical probe card mounting a series of probe needles and an adjustable vertically-mounted chuck vertically mounting a semiconductor wafer containing integrated circuits, each of said integrated circuits containing contact pads, said chuck and mounted wafer being movable with respect to said probe card; and wherein at least one of said tester and said prober are movable along a fixed horizontal path with respect to each other to dock said tester and prober together to electrically connect selected ones of said vertical array of horizontal connector pins to selected ones of said electrical connectors;

wherein movement of said chuck and mounted wafer makes an electrical contact between said contact pads and said probe needles; and wherein said prober includes a latching arm and said tester includes a latching keeper, said arm being latchable into said keeper upon docking of said prober and tester.

16. A method for testing semiconductor wafers containing integrated circuits including contact pads comprising:

providing a tester having a vertically oriented performance board fixedly positioned with respect to the tester, and said board including electrical connectors;

providing a prober including a vertical array of horizontal connector pins and a wafer-mounting chuck;

mounting a semiconductor wafer containing integrated circuits including contact pads on said chuck;

moving one of the tester and prober toward the other along a fixed horizontal predetermined path;

docking the tester and prober together to electrically connect said electrical connectors to said array of horizontal connector pins;

providing a vertical probe card mounting a series of probe needles on the prober; and further including the step, after the docking step, of moving said chuck and the mounted wafer to make an electrical contact between contact pads on integrated circuit on the wafer and said series of probe needles.

17. The method of claim 16 further comprising:

prior to said docking step, roughly aligning the prober and the tester; and latching the prober and the tester with respect to one another to effect said docking step.

* * * * *